United States Patent
Potucek

(10) Patent No.: US 6,563,379 B1
(45) Date of Patent: May 13, 2003

(54) HIGH VOLTAGE OPERATIONAL AMPLIFIER

(76) Inventor: Rudolf Karel Potucek, 19 Cromwell Ave. NW., Calgary, Alberta (CA), T2L 0M6

(*) Notice: Subject to any disclaimer, the term of this patent is extended or adjusted under 35 U.S.C. 154(b) by 0 days.

(21) Appl. No.: 10/062,085

(22) Filed: Feb. 1, 2002

(30) Foreign Application Priority Data

Jan. 22, 2002 (DE) .......................... 102 02 199

(51) Int. Cl.[7] ............................................. H03F 17/00
(52) U.S. Cl. ......................... 330/59; 330/127; 330/297
(58) Field of Search ...................... 330/59, 127, 297, 330/308

(56) References Cited

U.S. PATENT DOCUMENTS 3,893,037 A * 7/1975 Herbert ....................... 330/59
4,030,041 A * 6/1977 Sasaki ......................... 330/10
5,278,515 A * 1/1994 Mathews ..................... 330/59

* cited by examiner

*Primary Examiner*—Henry Choe

(57) ABSTRACT

Described is a high voltage, high current operational amplifier in which galvanic separation of the input and output stages is achieved by means of an optical bridge, consisting of an LED and a photoresistor or phototransistor. The output stage utilizes two current sources, connected with inverse polarity and controlled by the optical bridge, thus allowing the transition between the low-voltage input stage and the high voltage output stage in a single step. Depending on the exact embodiment of the amplifier this invention can be customized to function with the properties of a Class A, B or C operational amplifier and can, in each of these embodiments, be used as an isolation amplifier.

5 Claims, 9 Drawing Sheets

Contains components of invention
RP - components of invention
RA - connection example ☐ Contains components of invention
RP - components of invention
*RA* - connection example ☐ Contains components of invention
RP - components of invention
RA - connection example ☐ Contains components of invention
RP - components of invention
*RA* - connection example

HIGH VOLTAGE OPERATIONAL AMPLIFIER

FIELD OF THE INVENTION

This invention relates to a high voltage operational amplifier, and more particularly to a high-output voltage amplifier in which the input stage and output stage are electrically separated.

BACKGROUND OF THE INVENTION

An typical operational amplifier amplifies a voltage difference on the inputs to generate a desired output voltage. If the desired output voltage exceeds 50 V, the design of the amplifier typically cascades multiple transistors to reach the required control voltage for the output stage. This design leads to increased signal propagation times and results in intermodular distortions. In case of thermal overload or other component failure like the breakdown of a junction, a voltage breakdown between the input stage and output stage can occur, jeopardizing the low-voltage circuitry.

Thus the aim of this invention is to present a circuit design for the control of high voltages which will have short response times to the change of an input signal as well as providing effective electrical separation between the input and output circuitry.

SHORT DESCRIPTION

This invention relates to a high voltage operational amplifier in which the output stage is formed from one or two current sources controlled by opto-electronical means. The linearity of the output stage is achieved by means of a feedback loop. If the target output voltage is independent of the high voltage output, e.g. by means of generating the low-voltage feedback by means of a mechanical sensor, then this high voltage operational amplifier can be used as an isolation amplifier.

This invention allows the production of high voltage amplifiers for different voltage and current ranges with largely unchanged internal layout. The circuit as described by this invention is proof against short circuiting and guarantees, by merit of the electrical separation of input and output, the highest possible protection of circuitry connected to the input stage. This invention is suitable for mirror focusing controls, piezo controls, high-voltage power supplies, etc.

SHORT DESCRIPTION OF FIGURES

DETAILED DESCRIPTION

Three typical embodiments of the invention will be described to explain the functioning of the invention. In the following description of FIGS. 1, 2, 3, 4 and 5, equal abbreviations denote identical elements.

(1) Current Sources

For the description of these exemplary circuit designs, the current transfer ratio (CTR) between the LED diode and the phototransistor is assumed to be 100%. The physical properties of the circuit elements are idealized, e.g. the forward voltage of the LED diode is assumed to be zero V.

(1a) Current Source Using N-channel Power-MOSFET

Figure 1:
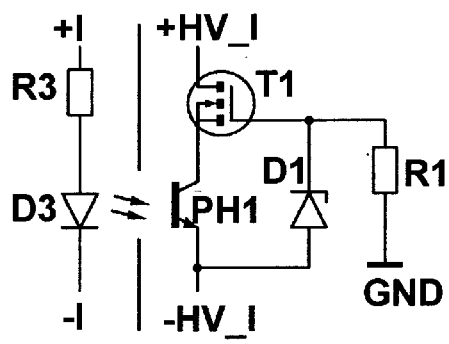
FIG. 1 shows an electrical schematic diagram of a current source as used in a typical embodiment of the current invention, formed with a N-channel PMOSFET transistor and an optical coupling consisting of a LED and a phototransistor (or photoresistor).

The optically controlled current source shown in FIG. 1 is formed using an N-channel PMOSFET transistor T1, a Zener-diode D1, a resistor R1, an LED D3 and a phototransistor PH1. When the voltage $V_{GS}$ of the transistor T1 is approximately constant (about 5 V), the voltage at the phototransistor PH1, $U_{CE}$, is also approximately constant $U_{CE} \approx U_{D1} - V_{GS}$. It follows that for CTR=100% the current across PH1 is equal to the current across the LED diode D3.

(1b) Complementary Current Source Using P-channel Power-MOSFET

Figure 2:
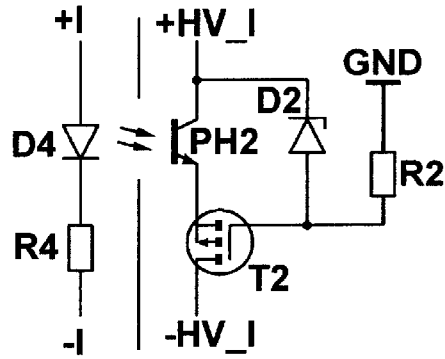
FIG. 2 shows an electrical schematic diagram of a complementary current source as used in a typical embodiment the current invention, formed with a P-channel PMOSFET transistor and an optical coupling consisting of a LED and a phototransistor (or photoresistor).

The optically controlled current source shown in FIG. 2 is formed using a P-channel PMOSFET transistor T2, a Zener diode D2, a resistor R2, an LED D4 and a phototransistor PH2. When the voltage $V_{GS}$ of the transistor T2 is approximately constant (about 5 V), the voltage at the phototransistor, $U_{CE}$, is also approximately constant $U_{CE} \approx U_{D1} - V_{GS}$. It follows that for CTR=100% the current across PH2 is equal to the current across the LED-diode D4.

(2) High Voltage Operational Amplifier, Class AI

Figure 3:
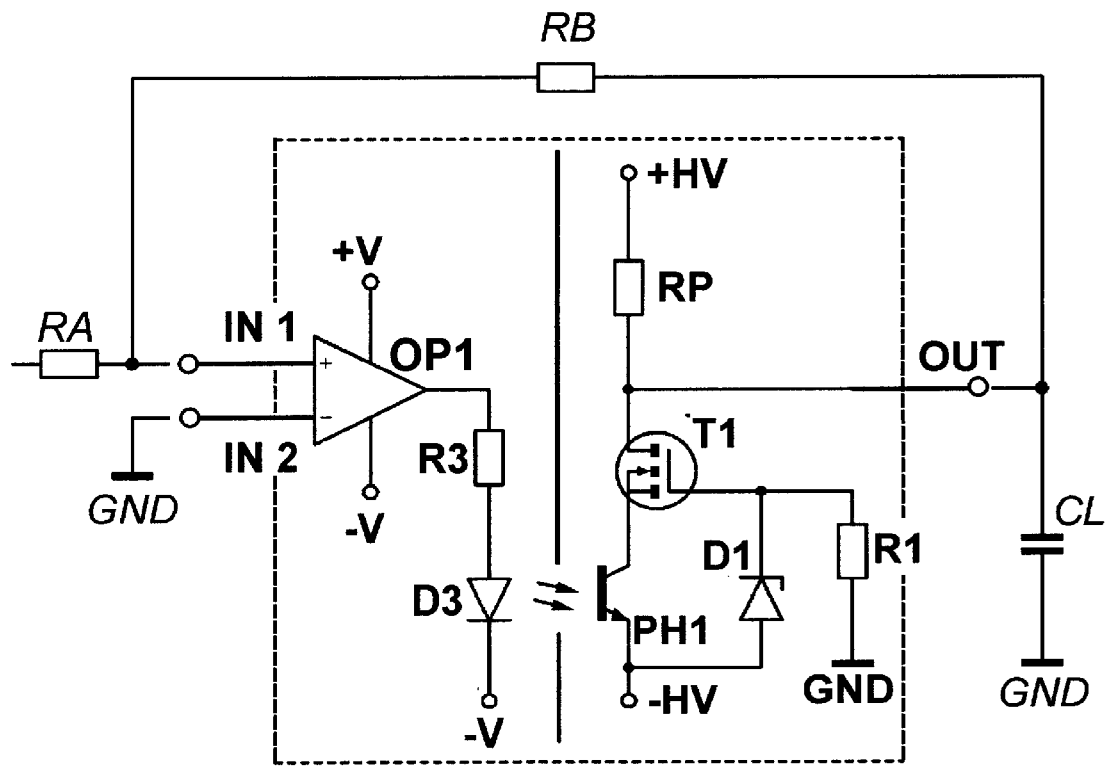
FIG. 3 shows an electrical schematic diagram of a first embodiment of a high-voltage amplifier (class AI) according to the invention in a typical load configuration.

In a first embodiment of the amplifier described by this invention, shown in FIG. 3 in a typical load configuration with resistors RA and RB to define the amplification and a capacitive load CL, the current source described in 1a in combination with the resistor RP and the differential amplifier OP1 form a high voltage amplifier of Class AI (similar to an output stage Class A) with the properties of a high voltage operational amplifier. Due to the linear dependence of photocurrent in PH1 on the current across the photodiode D3, the maximum output current available from the output stage is given by the supply voltage of the operational amplifier OP1 divided by R3 and multiplied by CTR. The maximum output voltage is defined by $V_{DS}$ of the PMOSFET transistor T1.

Starting with both inputs at equal potential of 0 V, the output voltage of the differential amplifier is also 0 V. The current of the LED-diode D3 and the current source are equal to:

$$\frac{0-(-\_V)}{R3} = I_{D3} = I_{PH1} = I_{T1}$$

and the output voltage of the high voltage operational amplifier is $$U_{out} = +\_HV - RP*I_{T1} = 0$$

Upon change of the input voltage, the differential amplifier OP1 is initially saturated and its output voltage will reach −_V or +_V. In the former case the current source is turned off and the capacitive load CL is charged across RP until the desired output voltage is reached. In the latter case the capacitive load CL is discharged by the current source until the desired output voltage is reached. The output voltage defined by the feedback loop is:

$$U_{out} = -U_{in} \cdot \frac{RB}{RA}$$

In the output stage the following equations hold:

$$I_{T_1} = \frac{HV - U_{out}}{RP} - \frac{U_{out}}{RB} \quad \text{or} \quad U_{out} = \frac{RB}{RP+RB} \cdot (HV - RP \cdot I_{T_1})$$

For capacitive loads the output voltage of the high voltage operational amplifier changes exponentially. There are, however, applications where this is not a problem and this is a cost effective way of creating a high-voltage operational amplifier. To achieve higher maximum current, the phototransistor can be replaced with a Darlington phototransistor, e.g. with a CTR of 1200%.

The connection of the N-channel PMOSFET transistor, T1, in this circuit is realized as a common gate connection, which is extremely fast. Thus the properties of the high voltage operational amplifier are largely dependent on the choice of the differential amplifier OP1. The high-voltage operational amplifier is then free of intermodular distortions and there is no danger of an internal high-voltage breakdown. If the target output voltage is independent of the high voltage output, e.g. due to generating the low-voltage feedback by means of a mechanical sensor, then this high voltage operational amplifier can be used as an isolation amplifier.

(3) High Voltage Operational Amplifier, Class BI

Figure 4:
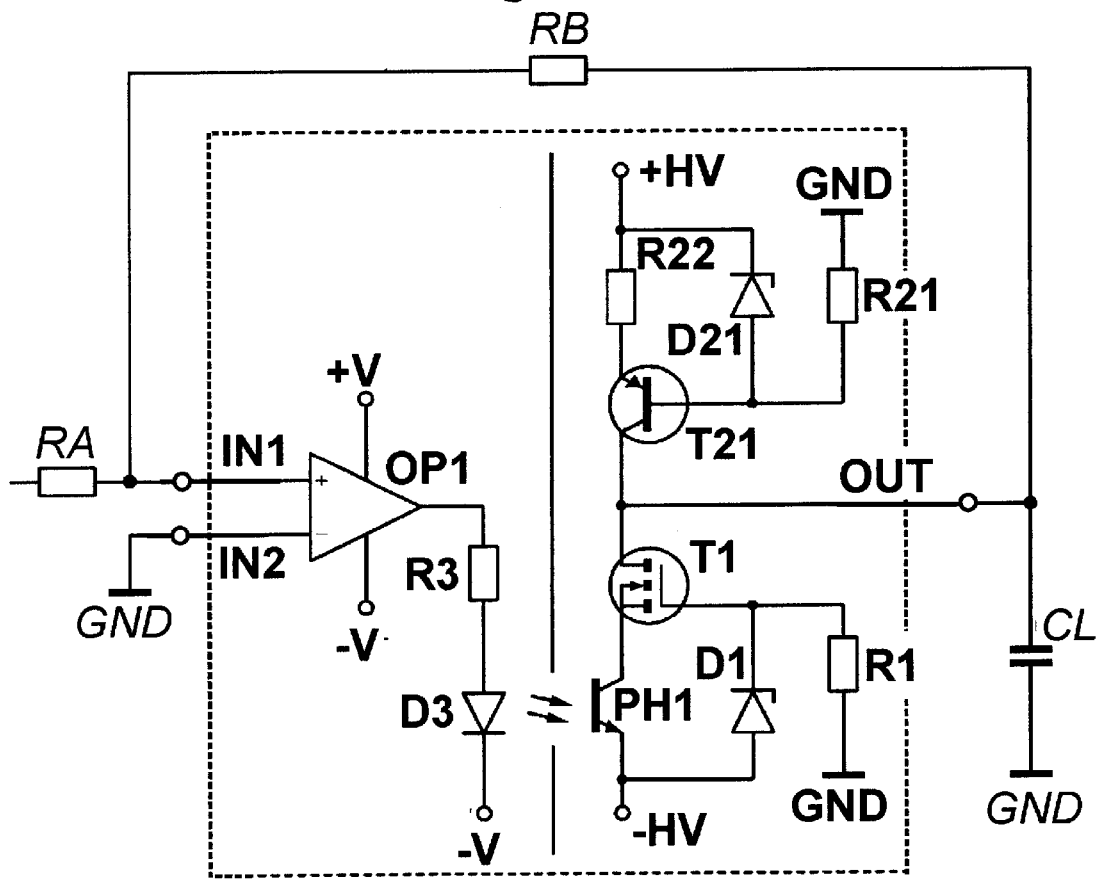
FIG. 4 shows an electrical schematic diagram of a second embodiment of a high-voltage amplifier (class BI) according to the invention in a typical load configuration.

In a second embodiment of the amplifier described by this invention, shown in FIG. 4 in a typical load configuration with resistors RA and RB to define the amplification and a capacitive load CL, the resistor RP of a class AI high voltage operational amplifier as described above is replaced by an arbitrary current source to form a class BI output stage (similar to output stage, Class B). In a possible embodiment this could be achieved using a bipolar transistor to deliver a constant current of, e.g. 5 mA. As a result of this approach, the output voltage of the high voltage operational amplifier will change linearly with the change of input voltage. In this embodiment the output stage is less noisy than a Class AI output stage. At the current state of the art, a class BI high-voltage operational amplifier constructed using the principles described by this invention is well suited for voltages up to ca. 400 V and high currents. If the target output voltage is independent of the high voltage output, e.g. due to generating the low-voltage feedback by means of a mechanical sensor, then this high voltage operational amplifier can be used as an isolation amplifier.

(4) High Voltage Operational Amplifier, Class CI

Figure 5:
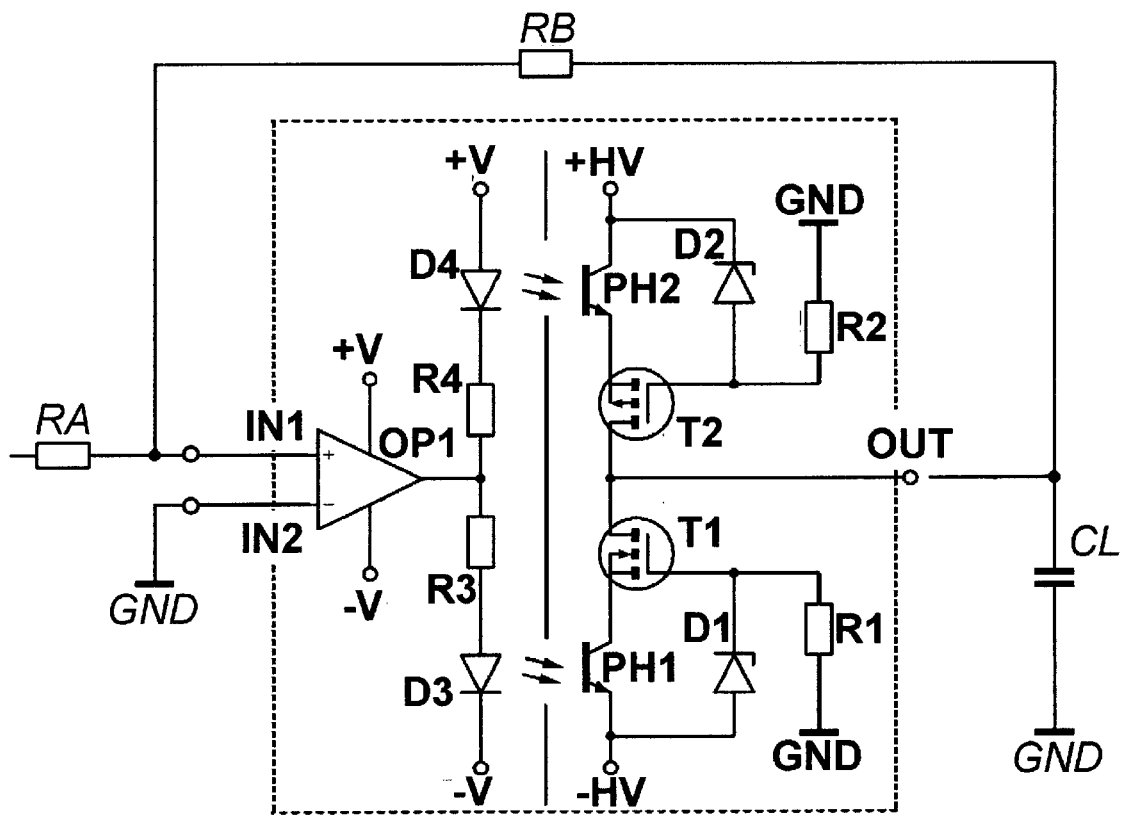
FIG. 5 shows an electrical schematic diagram of a third embodiment of a high-voltage amplifier (class CI) according to the invention in a typical load configuration.

In a third embodiment of the amplifier described by this invention, shown in FIG. 5, in a typical load configuration with resistors RA and RB to define the amplification and a capacitive load CL, a high voltage operational amplifier of Class CI is formed, in which two complementary current sources, as described in (1) above, are connected with opposite polarities (similar to the push-pull stage of a Class C output stage). The two current sources form, together with the differential amplifier, OP1, a high voltage amplifier of Class CI, with the properties of a high voltage operational amplifier.

Due to the linear dependence of photocurrent in PH1 (PH2) on the current across the photodiode D3 (D4), the maximum negative (positive) output current available from the output stage is given by the supply voltage of the operational amplifier OP1 divided by R3 (R4) and multiplied by CTR. The maximum output voltage is defined by $V_{DS}$ of the PMOSFET transistor T1 (T2).

Starting with both inputs at equal potential of 0 V, the output voltage of the differential amplifier is 0 V. The currents of the LED diodes, D3 and D4, and the current sources are given by:

$$\frac{(+\_V)-0}{R4} = I_{D4} = I_{PH2} = I_{T2} \quad \text{and}$$

$$\frac{0-(-\_V)}{R3} = I_{D3} = I_{PH1} = I_{T1}$$

Upon change of the input voltage, the differential amplifier is initially saturated and its output voltage reaches −_V or +_V. In both cases one of the current sources is shut down and the other produces its maximum current. The capacitive load CL is charged or discharged at the constant maximum current of the output stage until the desired voltage is reached. The output voltage defined by the feedback loop is:

$$U_{out} = -U_{in} \cdot \frac{RB}{RA}$$

In the output stage the following equation holds:

$$\frac{U_{out}}{RB} = \left(\frac{+\_V}{R4} + \frac{U_{out}}{2RB}\right) - \left(\frac{-\_V}{R3} - \frac{U_{out}}{2RB}\right)$$

In this embodiment the output of the high voltage operational amplifier is short-circuit-proof and, using a capacitive load CL, the output voltage changes linearly with a change of input voltage.

As opposed to a classical Class C output stage design, which has a small, constant quiescent current, the quiescent current in a class CI output stage as described by this invention is dynamically dependent on the output voltage. The highest quiescent current is observed at Uout=0V. A reduction of the supply voltage for the diodes D3 and D4 make is possible to customize the quiescent current as needed. It should be noted that for the quiescent current Iq the following relation applies:

$$I_q \geq \frac{HV}{RB}$$

To achieve higher maximum currents the phototransistors PH1 and PH2 can be replaced by Darlington phototransistors, e.g. with a CTR of 1200%.

As mentioned in (2) above, the current sources are extremely fast. Thus the properties of the high-voltage operational amplifier are largely dependent on the choice of the differential amplifier OP1. The high voltage operational amplifier is free of intermodular distortions and there is no danger of an internal high-voltage breakdown. If the target output voltage is independent of the high voltage output, e.g. due to generating the low-voltage feedback by means of a mechanical sensor, then this high voltage operational amplifier can be used as an isolation amplifier.

(5) Best Mode Description, Class AI

Figure 6:
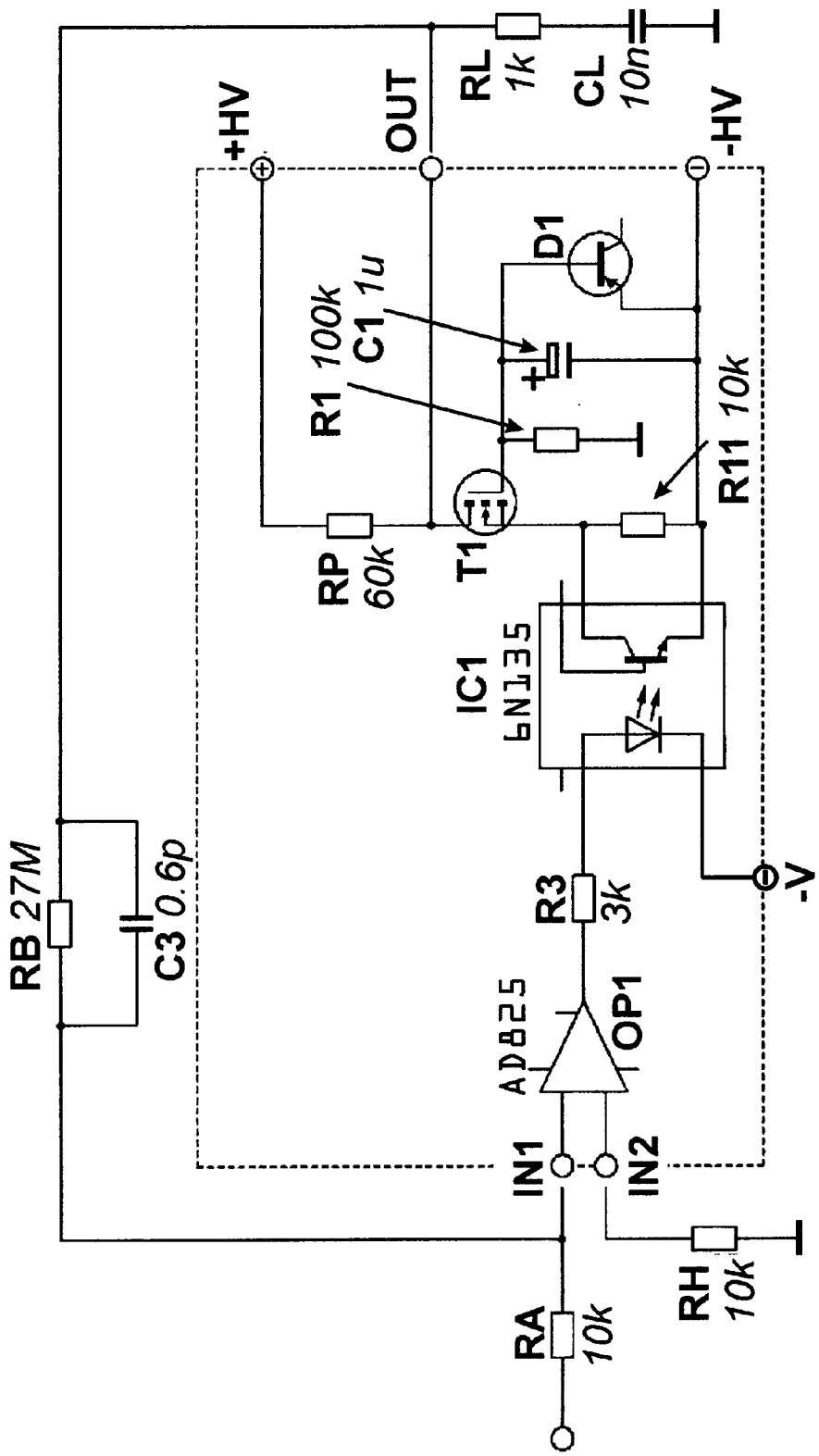
FIG. 6 shows a more detailed circuit diagram of the first embodiment of a high voltage amplifier (class AI) according to the invention.

FIG. 6 shows a typical embodiment of the high voltage operational amplifier (Class AI) as described by this invention. In this embodiment the amplifier is formed using four resistors, one Zener diode, one capacitor, one optocoupler and one operational amplifier AD825, preferentially latchup-free.

An example of FIG. 6:

| | |
|---|---|
| Max. current of OP1 | 10 mA |
| Supply voltage for OP1 | +/−15 V |
| max. voltage for T1 | 600 V |
| HV supply voltage | +/−300 V |
| Resistance R3 = 30V/0.01A | 3 kOhm |
| Resistance RP = 600V/0.01A | 60 kOhm |

The resistor R11 serves to protect the optocoupler from damage due to overvoltage. The supply voltage VM of the optocoupler in this embodiment is −15 V, connected to the supply voltage of the operational amplifier AD825. Instead of the Zener diode shown in the schematic FIG. 3, this embodiment utilizes the base-emitter connection of a low power NPN transistor (Avalanche Effect). The resistor RL prevents parasitic oscillations between the inductivity of the feed lines and the load capacitor CL.

Figure 7:
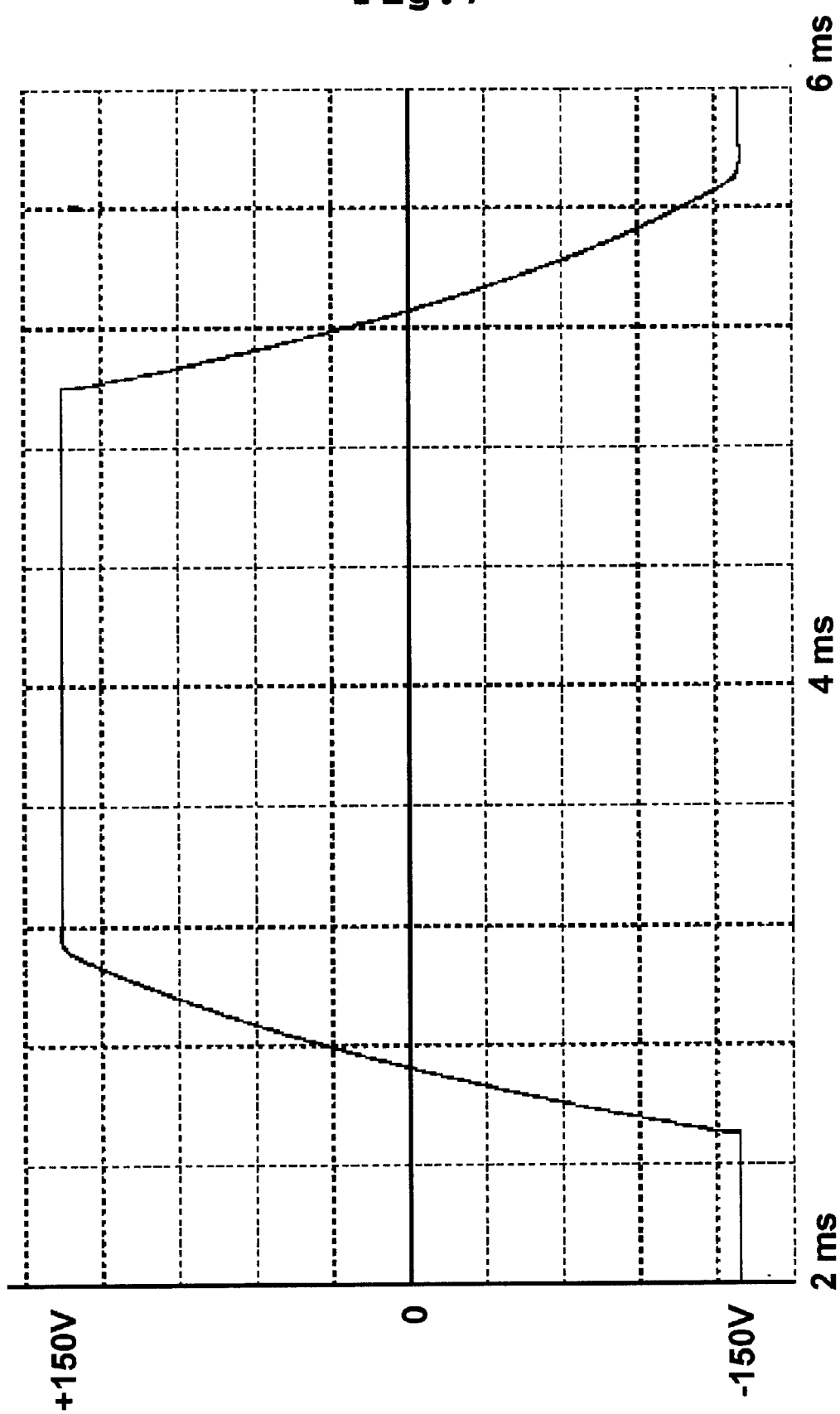
FIG. 7 shows the voltage response at the amplifier output of FIG. 6 as response to a rectangle signal applied to the amplifier input.

FIG. 7 shows the characteristic exponetionel response of the output voltage of the high-voltage operational amplifier to a square wave input signal of 100 mVpp.

Figure 8:
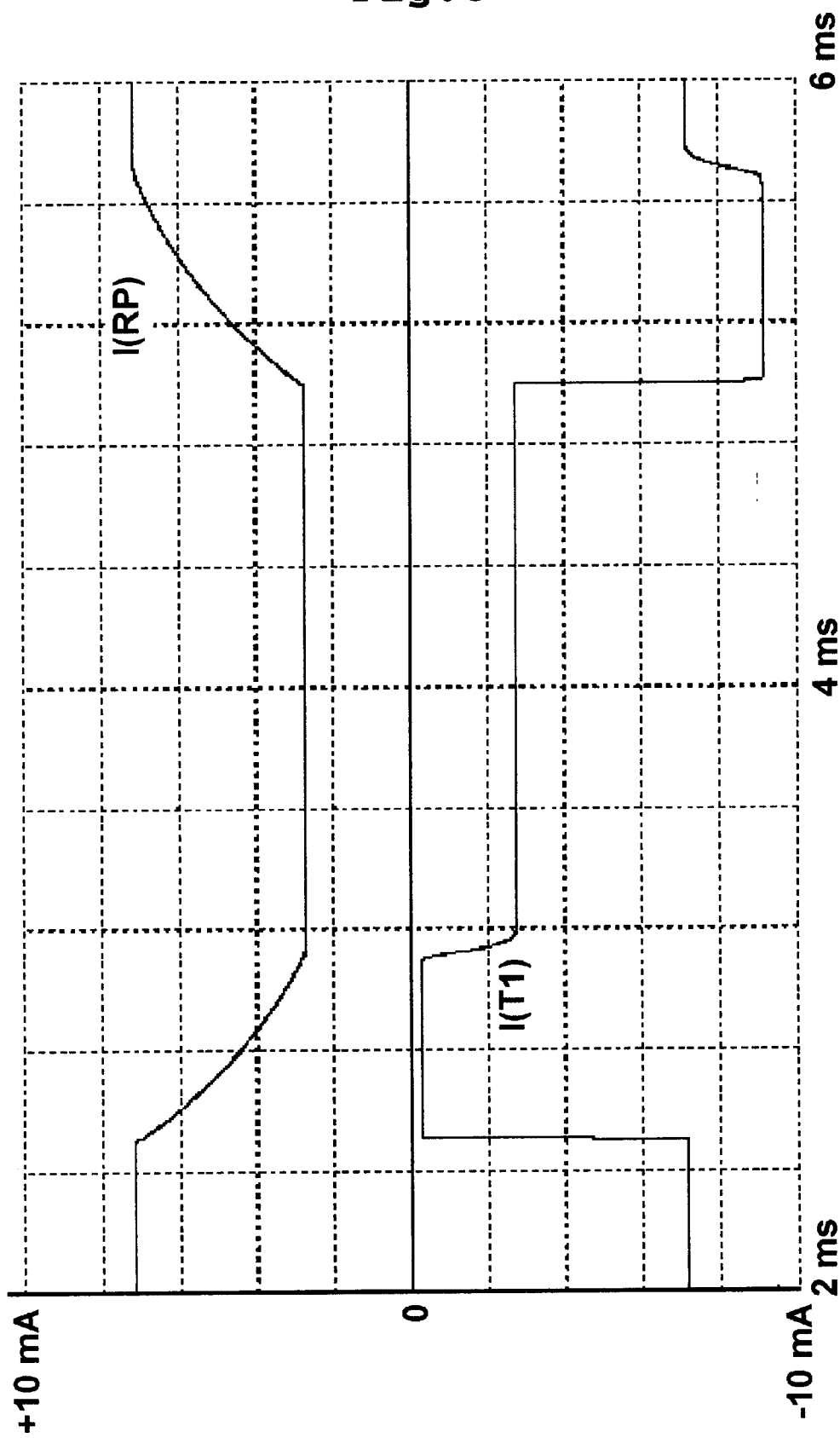
FIG. 8 shows the current responses at transistor T1 and resistor RP of FIG. 6 as response to a rectangle signal applied to the amplifier input.

For the same conditions FIG. 8 shows the currents across the transistor T1 and the resistor RP. As a result of increasing input voltage the transistor T1 is switched off and the capacitive load CL is charged across the resistor RL. As a result of decreasing input voltage the current source delivers its maximum current of 10 mA. At equilibrium the current in the current source is described by $$I_{T_1} = \frac{HV - U_{out}}{RP} - \frac{U_{out}}{RB}$$

(6) Best Mode Description, Class CI

Figure 9:
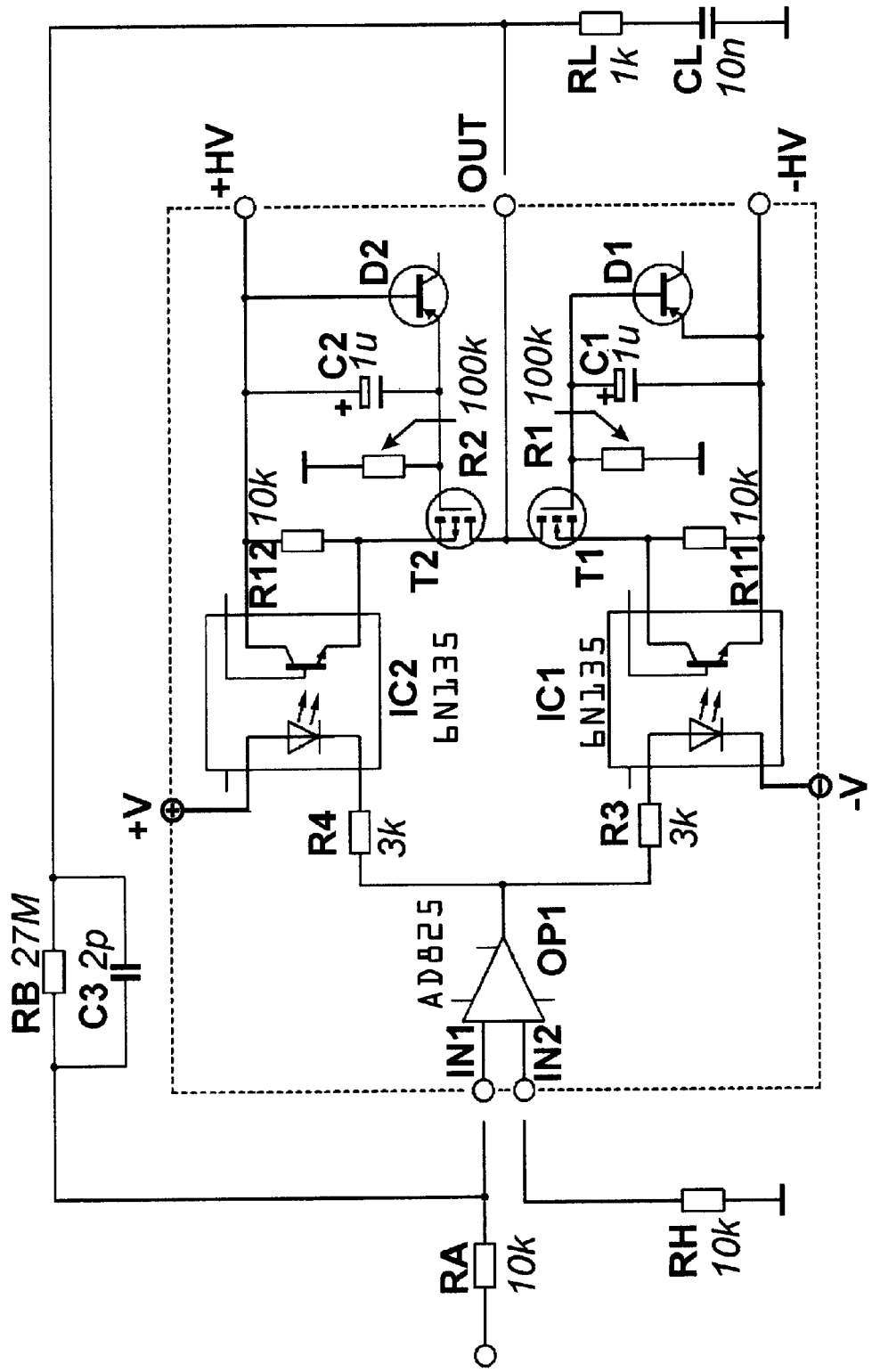
FIG. 9 shows a more detailed circuit diagram of the third embodiment of a high voltage amplifier (class CI) according to the invention.

FIG. 9 shows a typical embodiment of the high voltage operational amplifier (Class CI) as described by this invention. In this embodiment the amplifier is formed using six resistors, two Zener diodes, two capacitors, two optocouplers and one operational amplifier AD825, preferentially latchup-free. Instead of the Zener diode shown in the schematic, this embodiment utilizes the base-emitter connection of a low power NPN transistor (Avalanche Effect).

The resistors R11 and R12 protect the optocouplers from damage due to overvoltage. The supply voltages VP and VM of the optocouplers in this embodiment are +15 V and −15 V, respectively, connected to the supply voltages of the operational amplifier AD825. The resistor RL prevents parasitic oscillations between the inductivity of the feed lines and the load capacitor CL.

Example parameters of the circuit in FIG. 9:

| | |
|---|---|
| Max current of OP1 | 10 mA |
| Supply Voltage for OP1 | +/−15 V |
| max. $V_{DS}$ Voltage for T1 and T2 | 600 V |
| HV supply voltage | +/−300 V |
| Resistances R3 = R4 = 30V/0.01A | 3 kOhm |

Figure 10:
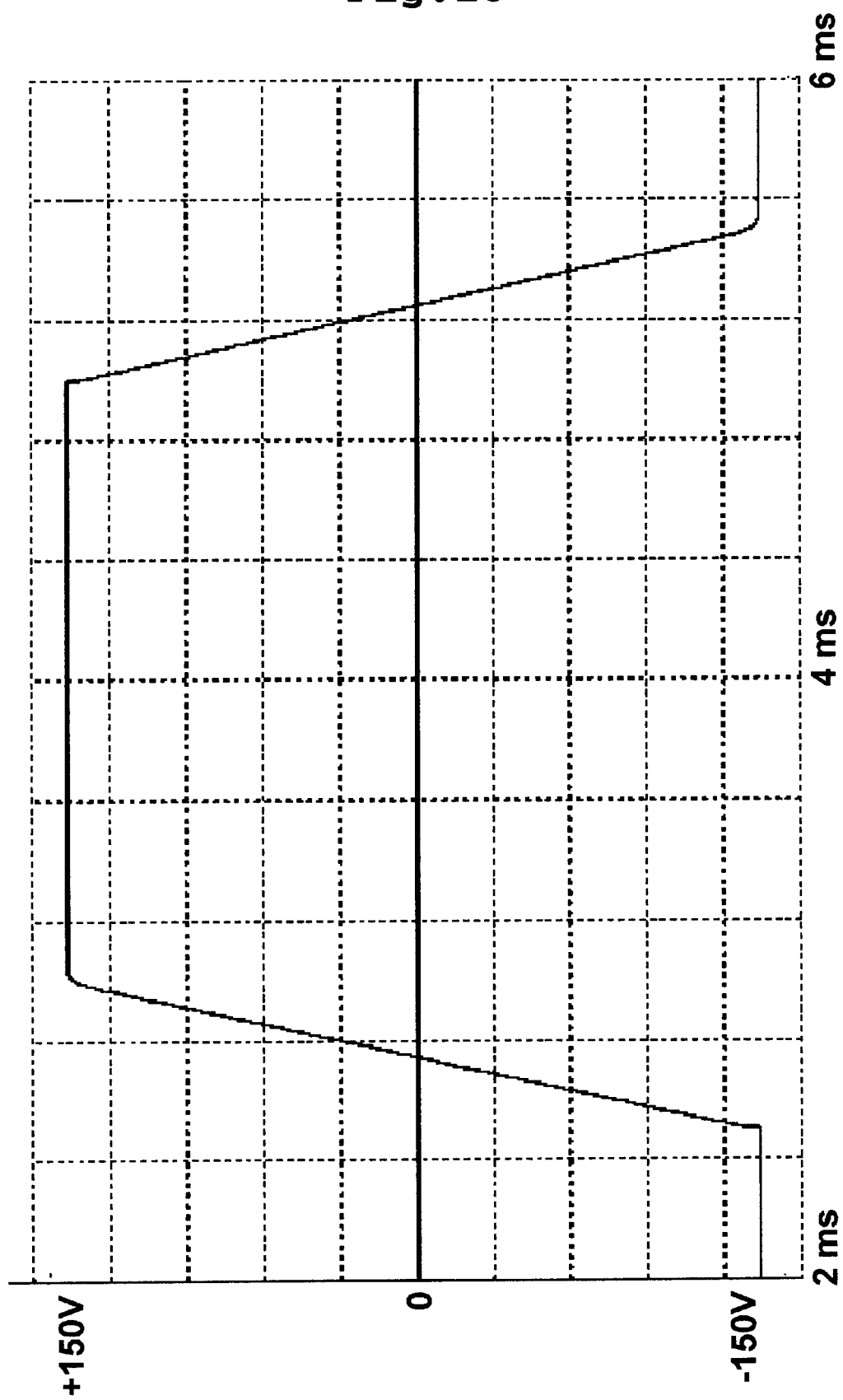
FIG. 10 shows the voltage response at the amplifier output of FIG. 9 as response to a rectangle signal applied to the amplifier input

FIG. 10 shows the characteristic linear increase of the output voltage as a result of potential step in the input signal. The voltage ramp for CL=10 nF is as expected:

$$\frac{I_{out} * \Delta t}{C} = \frac{(10*10^{-3})*(1*10^{-6})}{10*10^{-9}} = 1V \text{ and thus } \frac{\Delta U}{\Delta t} = \frac{1V}{1\mu s}$$

Figure 11:
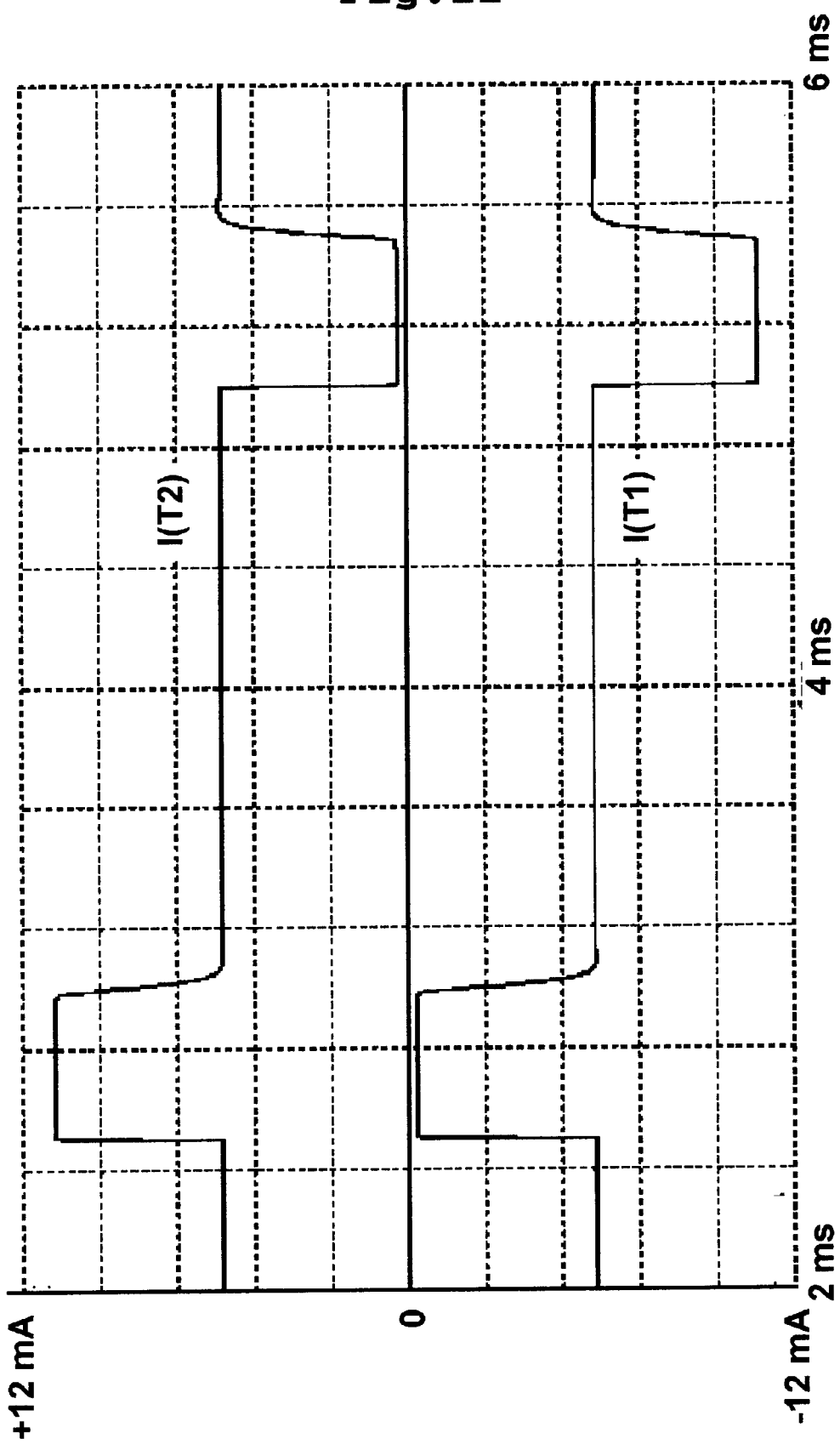
FIG. 11 shows the current responses at transistors T1 and T2 of FIG. 9 as response to a rectangle signal applied to the amplifier input

For the same conditions FIG. 11 shows the currents across transistors T1 and T2. As a result of increasing input voltage the current across T1=0 mA and the current across T2=10 mA. As a result of decreasing input voltage the situation is reversed and T1=10 mA and T2=0 mA. When both inputs are at the same voltage, both currents are 5 mA.

We claim:

1. A high-voltage operational amplifier comprising a low-voltage input stage coupled to a high-voltage output stage by optical means,
   wherein the input stage further comprises
      first and second input terminals for receiving a low voltage differential input signal;
      two input terminals for receiving the supply voltages for the low-voltage input stage;
      one input terminal to define the reference voltage (GND) for the input stage;
      a first differential amplifier;
      at least one optical signal source for coupling to the high-voltage output stage connected to the output of the first differential amplifier;
   and wherein the output stage further comprises
      an output terminal for providing a high-voltage output signal corresponding to the low voltage differential input signal;
      two input terminals for receiving the supply voltages for the high-voltage output stage;
      one input terminal to define the reference voltage (GND) for the output stage;
      two current sources connected in series and with opposite polarities to the high voltage input terminals;
      a connection between the high voltage output terminal and the connection point of the two current sources;
      at least one of the current sources comprising a photoresistor or phototransistor as part of the optical coupling of input and output stages, where the input terminal of the photoresitor or phototransistor is connected to the high voltage input terminal and the output terminal of the photoresistor or phototransistor is connected to the drain-source distance of a PMOSFET;
      at least one Zener diode connecting the high voltage input terminal with the gate of the PMOSFET;
      at least one resistor connecting the gate of the PMOSFET with the reference voltage terminal (GND);
   and wherein the optical coupling comprises
      at least one combination of a current controlled or voltage controlled light source and the photoresistor or phototransistor.

2. A high-voltage operational amplifier according to claim 1, in which each of the two current sources in the high-voltage output stage comprises at least one photoresistor or phototransistor, at least one PMOSFET, at least one Zener diode, and at least one resistor.

3. A high-voltage operational amplifier according to claim 1, in which one of the current sources in the high-voltage output stage is realized by connecting a resistor between one high voltage input terminal and the connection point between the two current sources.

4. A high-voltage operational amplifier according to claim 1, in which one of the current sources is realized as an arbitary constant-current source.

5. A high voltage operational amplifier according to claims 1, 2, 3 or 4 in which the GND input terminals for the input and output stages are internally connected.

* * * * *